United States Patent [19]

Gahle et al.

[11] Patent Number: 4,922,140

[45] Date of Patent: May 1, 1990

[54] CMOS/NMOS INTEGRATED CIRCUIT WITH SUPPLY VOLTAGE DELAY VARIATION COMPENSATION

[75] Inventors: Hans-Jurgen Gahle; Arnold Uhlenhoff, both of Emmendingen, Fed. Rep. of Germany

[73] Assignee: Deutsche ITT Industries GmbH, Freiburg, Fed. Rep. of Germany

[21] Appl. No.: 324,865

[22] Filed: Mar. 17, 1989

[30] Foreign Application Priority Data

Mar. 31, 1988 [EP] European Pat. Off. ........ 88105243.5

[51] Int. Cl.$^5$ ............................................. H03K 17/14
[52] U.S. Cl. .................................... 307/591; 307/443; 307/448; 307/481; 307/594; 331/57; 331/108 C
[58] Field of Search ............... 307/443, 446, 448, 451, 307/481, 491, 529, 272.2, 591, 594, 605, 308; 331/57, 108 A, 108 C

[56] References Cited

U.S. PATENT DOCUMENTS

| | | | |
|---|---|---|---|
| 3,931,588 | 1/1976 | Gehweiler | 331/108 C X |
| 4,016,434 | 4/1977 | De Fillippi | 307/591 X |
| 4,072,910 | 2/1978 | Dingwall et al. | 331/108 C X |
| 4,340,867 | 7/1982 | Sano | 307/594 X |
| 4,473,762 | 9/1984 | Iwahashi et al. | 307/594 |
| 4,494,021 | 1/1985 | Bell et al. | 307/591 |
| 4,641,048 | 2/1987 | Pollock | 307/443 X |
| 4,742,254 | 3/1988 | Tomisawa | 307/451 X |
| 4,845,390 | 7/1989 | Chan | 307/603 X |

FOREIGN PATENT DOCUMENTS 0219291 10/1986 European Pat. Off. .
60-25323 2/1985 Japan .

OTHER PUBLICATIONS

"Compensation for Variation in Circuit Delay", IBM TDB vol. 28, No. 12, May 1986 pp. 5180–5182.
IEEE Journal of Solid-State Circuits, vol. SC-13, No. 5, Oct. 1978, pp. 542–548; R. W. Knepper: "Dynamic Depletion Mode": an E/D MOSFET circuit Method for Improved Performance.
IEEE Transactions on Electron Devices, vol. ED-28, No. 7, Jul. 1981, pp. 886–888; D. C. Mayer et al.: "Analysis of the Switching Speed of a Submicrometer-Gate CMOS/SOS Inverter"*Figures 1,2*.
NERE/M Record-1967, pp. 168–169, "Technology and Performance of Integrated Complementary MOS Circuits*" by T. Klein.
Microelectronics Journal, vol. 13, No. 6, 1982, "A CMOS Process for VLSI Instrumentation" by Tong Qin Yi and J. M. Robertson.

Primary Examiner—David Hudspeth
Attorney, Agent, or Firm—Thomas L. Peterson

[57] ABSTRACT

A CMOS/NMOS integrated circuit realizes individual logic circuits with a combination of CMOS and enhancement-mode NMOS devices. The parameters of the CMOS and NMOS devices are selected such that the supply voltage dependency of the CMOS devices is offset by the supply voltage dependency of the NMOS devices. Thus, the propagation delays in the CMOS and NMOS devices, individually a function of supply voltage, remain constant for variations in the supply voltage. The logic circuits include analog-to-digital converters, adders, multipliers, flip flops and ring oscillators. The ring oscillator includes two blocks of inverters. The first block comprises CMOS inverters connected in series; the second block comprises enhancement-mode NMOS inverters connected in series. The output of the first block is connected to the input of the second block, and the output of the second block is connected to the input of the first block, thus forming a "ring" of inverters. Because the supply voltage dependency of the CMOS inverters is offset by the supply voltage dependency of the NMOS inverters, the oscillation frequency of the ring oscillator is independent of the supply voltage.

20 Claims, 1 Drawing Sheet

CMOS/NMOS INTEGRATED CIRCUIT WITH SUPPLY VOLTAGE DELAY VARIATION COMPENSATION

BACKGROUND OF THE INVENTION

This invention relates to CMOS/NMOS integrated circuits and more particularly to such circuits that realize logic functions with a combination of CMOS and NMOS devices such that circuit propagation delays remain constant despite variations in the supply voltage.

As one can ascertain, there are various classes of FET logic circuits that have been developed over the years. Once of the most widely employed is CMOS which employs the complementary symmetry of n-channel and p-channel units to allow a voltage swing from one transistor to the other with very low power dissipation per gate at standby. The propagation delay of these circuits is typically between 20 to 50 nano seconds. While CMOS devices have low quiescent power and good noise immunity, the logic packing density in CMOS devices is not as good as can be achieved by NMOS devices and certain other logic families. As one can ascertain, a large fan-out, for example, implies a larger load capacitance and thus a longer propagation delay.

The prior art was aware of this fact and there are references indicating the prior art which suggest the use of CMOS/NMOS integrated circuits to be used to fabricate digital integrated circuits. The article entitled "A CMOS Process for VLSI Instrumentation" by Tong Qin Yi and J. N. Robertson appeared in the *Microelectronics Journal*, Vol. 13, No. 6, 1982, pgs. 29–32. According to this article, a choice of CMOS/NMOS technology to implement the specified digital function depends upon the requirements of speed and packing density of the integrated circuit. In this manner, CMOS and NMOS devices are combined on the same integrated circuit chip and employ specific logic circuits using either only CMOS technology or only NMOS technology. Thus, the article discusses the fabrication of CMOS/NMOS integrated circuits and how CMOS devices are combined with NMOS devices on the same substrate to realize analog and digital circuits. The problem in conjunction with such approaches is that the propagation delay in a CMOS device, particularly in the CMOS inverter, determines the switching speed and cut-off frequency of the entire integrated circuit. This propagation delay, particularly for the CMOS inverter, is undesirably a function of the supply voltage. The prior art is well aware of this problem.

See an article entitled "Technology and Performance of Integrated Complementary MOS Circuits" by T. Kline in the *Journal NEREM Record*, 1967 on pgs. 168–169. As indicated, the article discusses the propagation delay in CMOS devices as a function of supply voltage. CMOS switching responses for example for 9 volts and 15 volts supply voltage are shown for comparison in FIG. 4.

This voltage dependence is an extremely troublesome problem especially when one desires to implement delay circuit elements as for example digital filters or ring oscillators whereby the propagation delay determines reliable circuit operation. Hence, by employing the CMOS inverter in such circuits one experiences great problems with power supply variation as affecting propagation delay.

It is therefore an object of the present invention to compensate for the voltage dependence of the propagation delay in combined circuits which employ CMOS/NMOS technology and which combined circuits are realized mainly by CMOS technology.

A "function" as used herein includes a subunit of the integrated circuit which, as will be explained, is implemented separately with a single, digital, basic circuit type. Such basic circuit types are for example the adder, the multiplier, the divider, the comparator, the memory, shift register, analog-to-digital converter, digital-to-analog converter, sample and hold cells as well as flip flops, inverters, and gates. Such circuits for example as adders, multipliers and so on are thus thought of being composed of separate cells. A gate as employed above means any logic circuit whose single output provides a signal depending upon the combination of signals at its input. For example, these can be AND, OR gates and so on.

For the purposes of the present invention an inverter is regarded as the simplest gates. The CMOS inverter employs a p-channel MOS transistor and an n-channel MOS transistor on the same substrate. The drain-source paths of the respective p- and n-channel transistors are connected in series with a junction thereof being an output and the respective gates are coupled or connected together. The drain-source paths are connected between the supply voltage and the reference voltage. During operation of the inverter, an input signal is applied to the gates causing one transistor to be held on while the other is held off. The output of the inverter is determined by the quiescent leakage current of the off transistor.

The concept employed with this invention is based upon the utilization within a function as described above of CMOS/NMOS circuits. Thus, in order to provide a constant propagation delay with power supply variation, a sub number p of the necessary basic circuits as CMOS circuits and a remaining sub number q enhancement mode NMOS circuits are employed. The NMOS circuits employ a current source, particularly a depletion mode transistor as a load device, for example, preferably as a depletion mode NMOS basic circuit. This approach completely departs from the above described prior art approach in which only entire functions are realized by either of the technologies referred to above but not utilizing a sub number p of CMOS basic circuits and a sub number q as enhancement mode NMOS basic circuits.

Thus, as one will ascertain, with the solution as described above, the oscillation frequency of ring oscillators for example can be made independent of the supply voltage without an additional voltage regulating circuit. Thus, the solution and circuits which are fabricated in accordance with this invention require no additional chip area which normally would be needed to accommodate a voltage regulating circuit. Such voltage regulating circuits for example have been shown in the prior art.

See for example European Pat. No. 0,219,291 filed on Oct. 6, 1986 entitled CMOS Integrated Circuit for Signal Delay by N. Tomisawa. This patent describes an integrated circuit using an odd number of CMOS gate circuits arranged in a row with a large current supply located in the end. The current supply keeps the supply voltage constant in order to stabilize the propagation delay of the CMOS devices.

See Japanese Patent No. 60-25323 entitled Semiconductor Integrated Circuit filed on July 22, 1983 for Y. Kitagawa. This discloses a CMOS inverter and an input stage connected to the gate thereof. The input stage is an n-channel depletion load inverter which provides the CMOS inverter with a threshold voltage that is independent of supply voltage.

It is an object of the present invention to provide logic circuits which employ both CMOS/NMOS integrated circuits utilizing a combination of CMOS and NMOS devices such that the propagation delays thereof remain constant despite variations in the supply voltage.

SUMMARY OF THE INVENTION

In accordance with the teachings of the present invention, logic circuits of an CMOS/NMOS integrated circuit are realized with a combination of CMOS and enhancement-mode NMOS devices. The parameters of the CMOS and NMOS devices are selected such that the supply voltage dependency of the CMOS devices is offset by the supply voltage dependency of the NMOS devices. Thus, the propagation delays in the CMOS and NMOS devices remain constant for variations in the supply voltage. The logic circuits include analog-to-digital converters, sample and hold cells, adders, multipliers, memory elements, digital-to-analog converters, shift registers, gates, flip-flops and ring oscillators. The current source of the enhancement-mode NMOS device can be a depletion-mode transistor.

A ring oscillator can be implemented on a CMOS/NMOS integrated circuit constructed in accordance with the present invention. At least two CMOS inverters are connected in series to form a first block. At least two enhancement-mode NMOS inverters are connected in series to form a second block. The output of the first block is connected to the input of the second block, and the output of the second block is connected to the input of the first block, thus forming a "ring" of inverters. Parameters of the inverters are selected such that the supply-voltage dependency of the CMOS inverters is offset by the supply voltage dependency of the NMOS inverters. Thus, the oscillation frequency of the ring oscillator is independent of the supply voltage, thereby eliminating the need for a voltage-regulating circuit. The additional logic required for this implementation is offset by the elimination of the voltage-regulating circuit; therefore, no additional chip area is required.

DETAILED DESCRIPTION OF THE FIGURES

Figure 1:
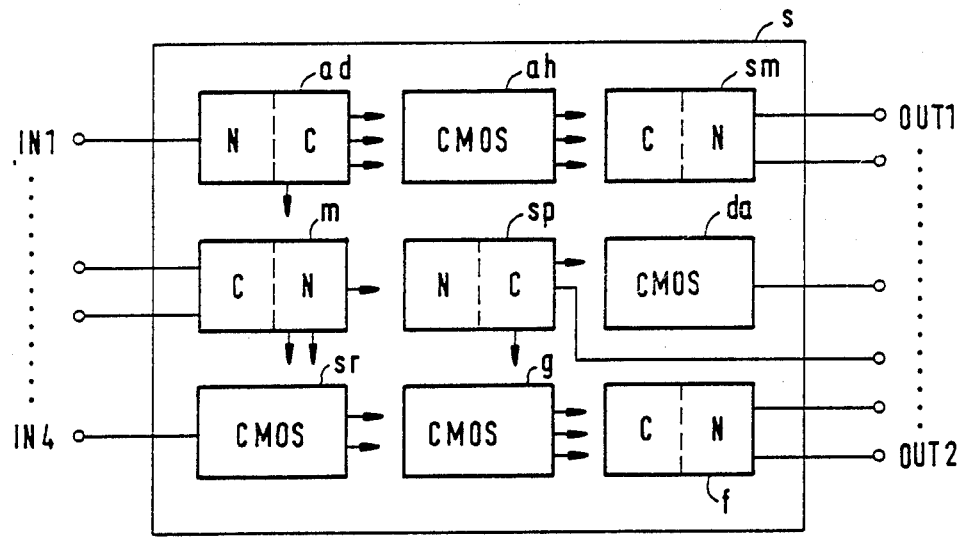
FIG. 1 is a schematic diagram of a CMOS/NMOS integrated circuit constructed in accordance with the present invention.

Referring to FIG. 1, there is shown an integrated circuit s having logic functions that are implemented with CMOS and NMOS devices and all are fabricated on a single integrated circuit chip. The logic functions are realized by the following logic circuits: An analog-to-digital converter ad, a sample-and-hold cell ah, an adder sm, a multiplier m, a memory element sp, a digital-to-analog converter da, a shift register sr, a gate g, and flip-flop f. The present invention is not limited to this configuration since there are many variations of these and other digital and analog circuits. Therefore, in another embodiment, the integrated circuit s may also include digital elements such as ring oscillators, delay elements and digital filters, and analog stages, such as amplifiers.

The external connections to the integrated circuit s include input lines IN1–IN4, and output lines OUT-1–OUT6. Interconnections within the integrated circuit s are made between various logic circuits, or from logic circuits to the output lines OUT1–OUT6 and inputs lines, IN1–IN4. The concrete interconnection of the logic circuits ad, ah, sm, m, sp, da, sr, ga and f are dependent on the specific configuration of the integrated circuit s and on the overall function for which the circuit is designed.

In the integrated circuit s shown in FIG. 1, the following logic circuits are constructed exclusively with CMOS technology: The sample and hold cell ah, digital-to-analog converter da, shift register r and gate g. The remaining logic circuits are realized by a combination of CMOS and NMOS devices. These circuits, designated NC or CN, include the analog-to-digital converter ad, adder sm, multiplier m, memory element sp, and flip-flop f.

Each logic circuit designated CN or NC is implemented with a total of p+q CMOS and NMOS devices. The subnumber p corresponds to the number of devices implemented with CMOS technology, while the remaining subnumber q corresponds to the number of devices implemented in enhancement-mode NMOS technology. Dependence upon the supply voltage can be adjusted with high accuracy by varying the respective layout and manufacturing parameters. In this manner, the supply voltage dependence of the propagation delay in the CMOS devices of block C is compensated by the supply-voltage dependence of the propagation delay of the NMOS devices in block N. As a result, the propagation delay is not affected by variations in the supply voltage.

The integrated circuit s is fabricated through a CMOS process that is described in an article entitled "A CMOS Process for VLSI Instrumentation" by Tong Qin Yi and J. M. Robertson in Microelectronics Journal, Vol. 13, No. 6, 1982, pp. 29–32. The CMOS process is based on a LOCOS structure with single or double N+ silicon gates, ion implanted source and drain electrodes and plasma etched critical features. The wafer is a p-type silicon of <100> orientation and having high resistivity. N-wells for the p-channel devices are formed by phosphorous implantation. These N-wells incorporate geometry-reduction techniques developed for NMOS technology.

Figure 2:
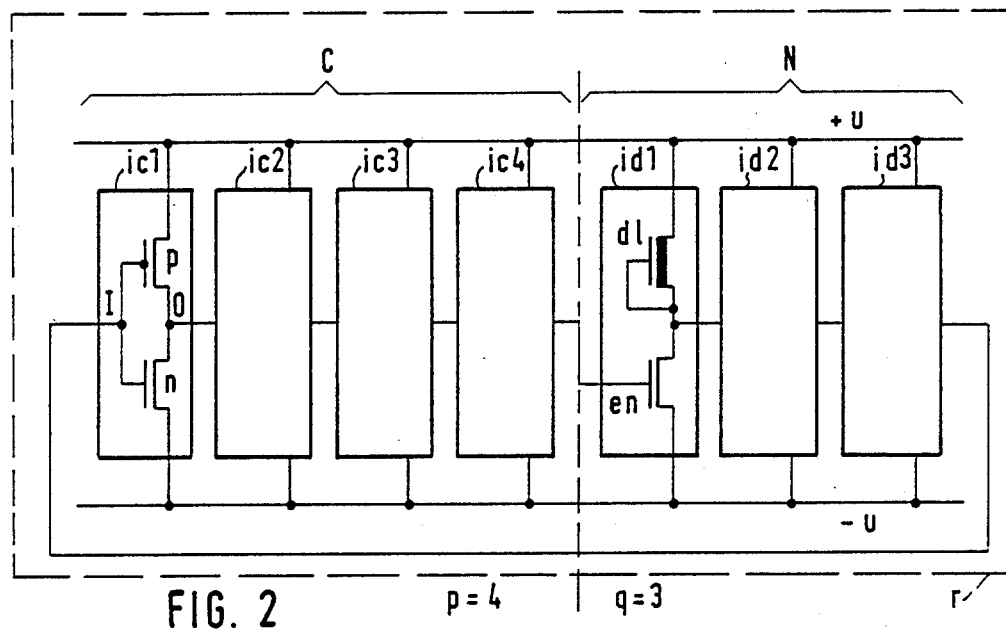
FIG. 2 is a schematic diagram of a ring oscillator constructed in accordance with the present invention.

Referring now to FIG. 2, a seven-stage ring oscillator r is shown with four CMOS inverters ic1–ic4 and three NMOS inverters id1–id3. Hence, for this logic circuit, the parameter p=4 and the parameter q=3. The four CMOS inverters are connected in series, forming a block C. The three NMOS inverters id1–id3 are also connected in series, forming a block N. The output of CMOS inverter ic4 is connected to the input of NMOS inverter id1, and the output of NMOS inverter id3 is connected to the input of CMOS inverter ic1. Thus, the inverters ic1–ic4 and id1–id3 are connected in a "ring."

The inverters in blocks C and N are connected in the correct phase for starting oscillations. To interrupt the ring oscillator r, either a NOR or NAND gate (not shown) is connected between two inverters. For example, the correct phase condition can be cancelled by means of an input signal through the NOR or NAND gate.

Each CMOS inverter ic1-ic4 consists of a p-channel MOS transistor p and an n-channel MOS transistor n. With respect to CMOS inverter ic1, the gates of the p- and n-channel MOS transistors p and n are coupled together at junction I. The respective drain-source paths of the transistors p and n are connected in series at the junction 0. The drain of each transistor p is connected to the supply voltage +u. The source of each transistor n is connected to the reference voltage −u. An input signal is applied to junction I of ic1. Junction 0 is the output of the inverter ic1.

Each P- and N-channel transistor p and n in block C has a channel length of 1.5 microns. The P-channel transistors n have a channel width of 30 microns and a gate threshold voltage of −0.75 V, and the N-channel transistors n have a channel width of 15 microns and a gate threshold voltage of +0.75 V.

Each NMOS inverter id1-id3 consists of two n-channel MOS transistor dl and em. Transistor dl has its gate tied to its source; it operates in the depletion mode and is adapted for use as a load device with its gate being tied to its source. Transistor em operates in the enhancement mode. The respective drain-source paths of transistors dl and em are connected in series with the junction therebetween forming the output for the NMOS inverter. The gate of transistor em provides the input to the NMOS inverter. The drain of each transistor dl is connected to the supply voltage +u, and the source of each transistor is connected to the reference voltage −u.

The depletion-load inverters of block N are divided into two "groups". For depletion-load inverters id1 and id2, the depletion-mode transistors dl have a channel length of 2 microns and a channel width of 14 microns, while the enhancement-mode transistors en have a channel length of 1.5 microns and a channel width of 15 microns. For the third depletion-load inverter id3, the depletion-mode transistor dl has a channel length of 2 microns and a channel width of 20 microns, while the enhancement-mode transistor em has a channel length of 1.5 microns and a channel width of 15 microns. All depletion-mode transistors dl have a gate-source threshold voltage of −2 V, and all enhancement-mode transistors em have a gate threshold voltage of −0.75 V.

Fabrication techniques for the ring oscillator r are the same as those described for the integrated circuit s. Dependance upon the supply-voltage can be adjusted with high accuracy by varying the respective layout and manufacturing parameters.

Although the present invention has been described in connection with two highly specific exemplary embodiments thereof, it will be understood that many variations and modifications can be made by those of ordinary skill in the art. Therefore, it is manifestly intended that this invention be only limited by the claims and the equivalents thereof.

We claim:

1. A CMOS/NMOS integrated circuit for implementing given functions each of which function is implemented with a single basic circuit type with said given function implemented by a first subnumber p of basic circuits required for said function as CMOS basic circuits (C) and a remaining subnumber (q) implemented as enhancement-mode NMOS basic circuits (n) where the subnumber p is selected so that the supply voltage dependence of the propagation delay in the CMOS basic circuits (C) is compensated for by the supply voltage dependence of the propagation delay in the NMOS basic circuits (n).

2. A CMOS/NMOS integrated circuit according to claim 1, wherein said NMOS device includes a current source that is a depletion-mode transistor employed as a load.

3. A CMOS/NMOS integrated circuit according to claim 1, wherein said single basic circuit type is an adder.

4. A CMOS/NMOS integrated circuit according to claim 1, wherein said single basic circuit type is a multiplier.

5. A CMOS/NMOS integrated circuit according to claim 1, wherein said single basic circuit type is a divider.

6. A CMOS/NMOS integrated circuit according to claim 1, wherein said single basic circuit type is a comparator.

7. A CMOS/NMOS integrated circuit according to claim 1, wherein said single basic circuit type is a memory element.

8. A CMOS/NMOS integrated circuit according to claim 1, wherein said single basic circuit type is a shift register.

9. A CMOS/NMOS integrated circuit according to claim 1, wherein said single basic circuit type is an analog-to-digital converter.

10. A CMOS/NMOS integrated circuit according to claim 1, wherein said single basic circuit type is a digital-to-analog converter.

11. A CMOS/NMOS integrated circuit according to claim 1, wherein said single basic circuit type is a sample and hold cell.

12. A CMOS/NMOS integrated circuit according to claim 1, wherein said single basic circuit type is a flip-flop.

13. A CMOS/NMOS integrated circuit according to claim 1, wherein said single basic circuit type is an inverter.

14. A CMOS/NMOS integrated circuit according to claim 1, wherein said single basic circuit type is a gate.

15. A CMOS/NMOS integrated circuit according to claim 1, wherein said single basic circuit type is a ring oscillator.

16. A CMOS/NMOS integrated circuit according to claim 15, wherein said CMOS devices are inverters that are connected in series to form a first block, and said NMOS devices are inverters that are connected in series to form a second block, the output of the first block being connected to the input of the second block, the output of the second block being connected to the input of the first block, whereby a ring of inverters is formed.

17. A CMOS/NMOS integrated circuit according to claim 16, said ring oscillator further comprising a NOR gate, having an output and one input that are connected between two inverters for interrupting the phase of the oscillator.

18. A CMOS/NMOS integrated circuit according to claim 16, said ring oscillator further comprising a NAND gate having an output and one input connected between two inverters for interrupting the phase of the oscillator.

19. A ring oscillator connected to a supply voltage comprising at least two CMOS inverters connected in series to form a first block, and at least two enhancement-mode NMOS inverters connected in series to form a second block, the output of the first block being connected to the input of the second block, the output of the second block being connected to the input of the first block thus forming a ring of inverters, the parameters of each CMOS and NMOS device being selected such that the supply voltage dependency of said NMOS inverter offsets the supply voltage dependency of the CMOS inverters, whereby the propagation delays of said CMOS and NMOS devices remain constant for variations in the supply voltage.

20. A ring oscillator according to claim 19, further comprising a means for interrupting the operation of the oscillator.

* * * * *